US007746667B1

(12) United States Patent
Baiza et al.

(10) Patent No.: US 7,746,667 B1
(45) Date of Patent: Jun. 29, 2010

(54) TELESCOPING SUPPORT CROSSBAR FOR A CABLE MANAGEMENT ARM

(75) Inventors: Julian S. Baiza, Arlington, TX (US); Jianhong Wang, Singapore (SG); Yueming Xu, Singapore (SG); Mushan Huang, Singapore (SG); Wenming Yang, Singapore (SG)

(73) Assignee: Central Industrial Supply Company, Tucson, AZ (US)

( * ) Notice: Subject to any disclaimer, the term of this patent is extended or adjusted under 35 U.S.C. 154(b) by 14 days.

(21) Appl. No.: 11/999,414

(22) Filed: Dec. 5, 2007

(51) Int. Cl.
*H02B 1/01* (2006.01)

(52) U.S. Cl. ...................................... 361/825; 361/756

(58) Field of Classification Search ......... 361/825–826, 361/727, 807, 810
See application file for complete search history.

(56) References Cited

U.S. PATENT DOCUMENTS

| | | | | |
|---|---|---|---|---|
| 4,614,383 A * | 9/1986 | Polley et al. | ................ | 312/273 |
| 6,305,556 B1 * | 10/2001 | Mayer | ......................... | 211/26 |
| 6,600,665 B2 | 7/2003 | Lauchner | | |
| 7,189,924 B1 | 3/2007 | Popescu et al. | | |
| 7,472,795 B2 * | 1/2009 | Dubon et al. | ................. | 211/26 |
| 2005/0145582 A1 | 7/2005 | Dubon et al. | | |
| 2006/0081735 A1 | 4/2006 | Chen et al. | | |
| 2006/0081736 A1 | 4/2006 | Chen et al. | | |
| 2006/0113433 A1 | 6/2006 | Chen et al. | | |
| 2007/0017883 A1 | 1/2007 | Bridges et al. | | |

FOREIGN PATENT DOCUMENTS

| | | |
|---|---|---|
| GB | 002420964 A | 6/2006 |
| GB | 002425245 A | 10/2006 |
| JP | 354034090 A | 3/1979 |
| JP | 354034091 A | 3/1979 |

* cited by examiner

*Primary Examiner*—Hung S Bui
(74) *Attorney, Agent, or Firm*—Mark W. Handley

(57) ABSTRACT

A telescoping support member (42) is provided for supporting a central portion (38) of a cable management arm (24) for use with drawer slides (14, 16). The drawer slides (14, 16) each have a cabinet member (18), an intermediate member (20) and a chassis member (22). The cable management arm (24) is secured on one end to one of the chassis members (22) and on an other end to one of the cabinet members (18). The support member (42) has a first end (50) pivotally secured in fixed relation to one of the intermediate members (20) and a second end (52) pivotally secured in fixed relation to one of the cabinet members (18). Extension of the drawer slides (14, 16) extends the cable management arm (24) and the support member (42), with said support member (42) disposed beneath and in sliding engagement with the central portion (38) of the cable management arm (24).

17 Claims, 4 Drawing Sheets

8 22 20 12 22 14 36 32 50 28 112 114 20 10 18 30 16 38 48 58 44 18 24 26 34 40 42 46 52

22
12
20
16
18
22
114
112
8
20
36
32
28
10
30
48
44
46
14
50
38
58
42
52
24
18
26
40
34

16
12
14
24
42

58
54
50
42
14
18
86
60
80
84
70
76
82
78
78
74

14
88
18
70
66
58
50
42

60
66
68
64
62
62

TELESCOPING SUPPORT CROSSBAR FOR A CABLE MANAGEMENT ARM

TECHNICAL FIELD OF THE INVENTION

The present invention relates in general to cabinets and drawers, and in particular, to cable management arms for securing cabling between cabinets and slidably extending equipment drawers.

BACKGROUND OF THE INVENTION

Prior cable management arms ("CMA's") have been provided for securing cabling between equipment racks, or cabinets, and drawer chassis. Chassis have included electronic equipment drawers which require cabling for power and for passing data signals to and from the chassis. CMA's typically have two or more parts which are pivotally connected together. One end of a CMA is secured in fixed relation to a cabinet, and the other end of the CMA is moveable relative to the fixed end of the CMA and secured to a rearward end of the chassis. An intermediate portion of the CMA will move with the cabling as the chassis is extended and then later retracted from the cabinet. As the height allocated for chassis in equipment racks is becoming smaller and CMA's are being made of lighter weight materials to save costs, the amount of weight which may be supported by the intermediate portions of the CMA's is being reduced. The weight of the cabling may cause unsupported portions of lighter weight CMA's to sag downward, which may cause interference with adjacent equipment or failure of the CMA.

SUMMARY OF THE INVENTION

A cable management ("CMA") is provided with a telescoping support crossbar for supporting the CMA as it is extended with a chassis. The CMA is preferably used with three part drawer slides, which have a cabinet member mounted in fixed relation to a rack frame of the cabinet, an intermediate member which is slidably extensible from within the cabinet member, and a chassis member which is slidably extendible from within the intermediate member. The chassis is mounted in fixed relation to the chassis member. A CMA is provided with one end pivotally secured in fixed relation to the rearward end of the chassis member and the other end pivotally secured in fixed relation to the rearward end of the cabinet member. Both ends of the CMA are preferably secured to a single drawer slide, on one side of the rack. A telescoping support crossbar is provided with first and second ends. The first end is pivotally secured to a rearward end of a cabinet member of a drawer slide which is disposed opposite to and spaced apart from a drawer slide to which the CMA is mounted. The opposite end of the telescoping support crossbar is mounted to the rearward end of the intermediate slide member of the drawer slide to which the CMA is secured. Extension of the drawer slides with the chassis results in the CMA sliding forward, slidably supported upon the telescoping support crossbar to prevent the weight of cabling secured to the CMA from causing the CMA to sag. The CMA is not secured to the telescoping support crossbar, such that the CMA is freely moveably upon the telescoping support crossbar in two orthogonally disposed directions in a horizontal plane.

DESCRIPTION OF THE DRAWINGS

For a more complete understanding of the present invention and the advantages thereof, reference is now made to the following description taken in conjunction with the accompanying Drawings in which

FIG. 1 is a perspective view of the CMA and the telescoping support crossbar mounted to drawer slides disposed in extended positions;

FIG. 2 is a perspective view of the CMA and the telescoping support crossbar mounted to drawer slides disposed in retracted positions;

FIG. 3 is an exploded view of a mounting bracket and pivot pin for securing a forward end of the telescoping support crossbar to an intermediate member of a drawer slide;

FIG. 4 is an assembled view of the mounting bracket and the pivot pin for securing the forward end of the telescoping support crossbar to the intermediate member of the drawer slide;

FIG. 5 is a perspective view of the pivot pin;

FIG. 6 is a partially exploded view of a mounting bracket for securing the telescoping support crossbar to the rearward end of a cabinet member of a second drawer slide; and FIG. 7 is an assembled view of the mounting bracket for securing the telescoping support crossbar to the rearward end of the cabinet member of the second drawer slide.

DETAILED DESCRIPTION OF THE INVENTION

Figure 1:
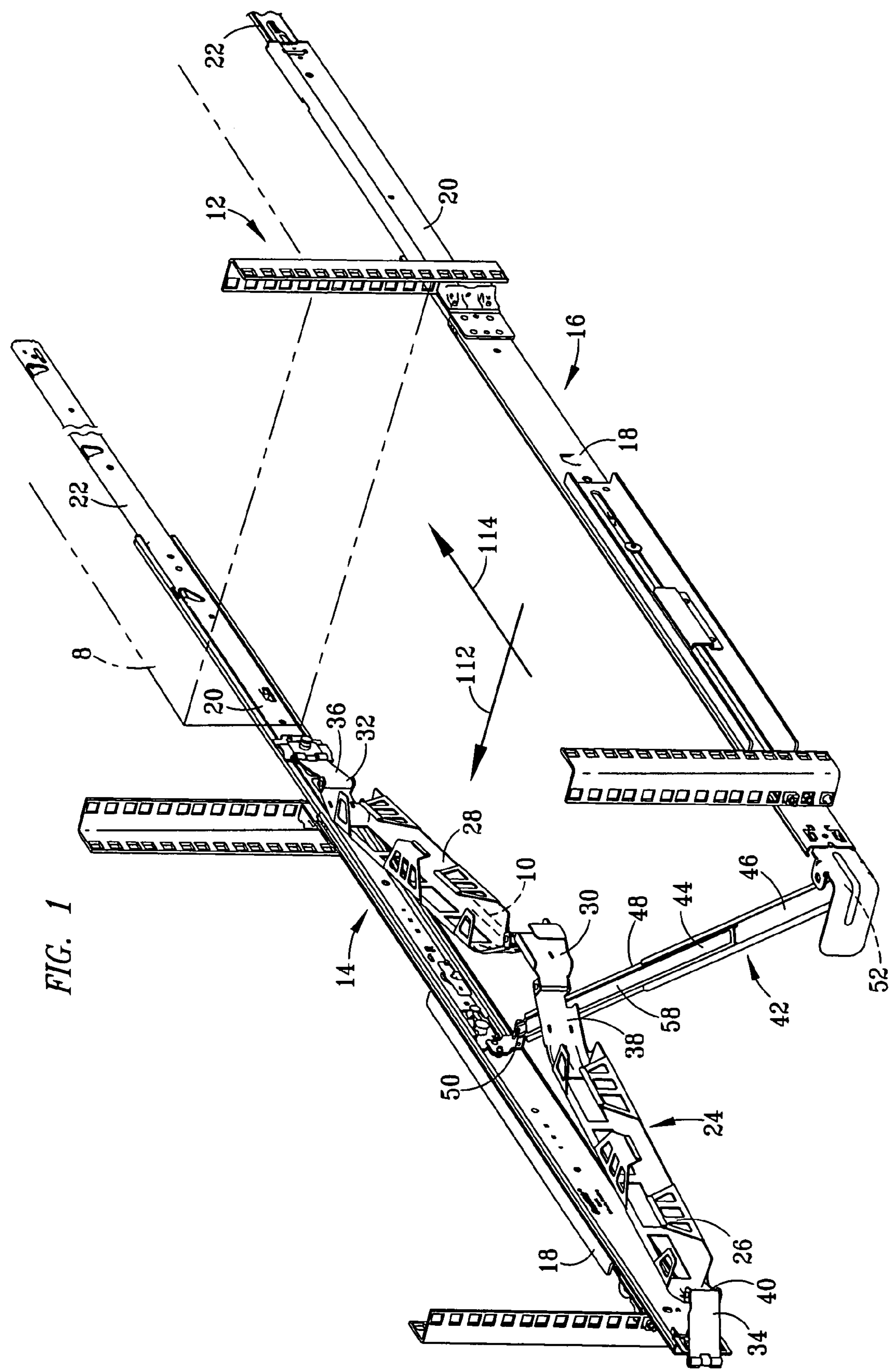
FIGS. 1 through 7 show various aspects for a telescoping support crossbar for a cable management arm ("CMA") made according to the present invention, as set forth below.
Figure 2:
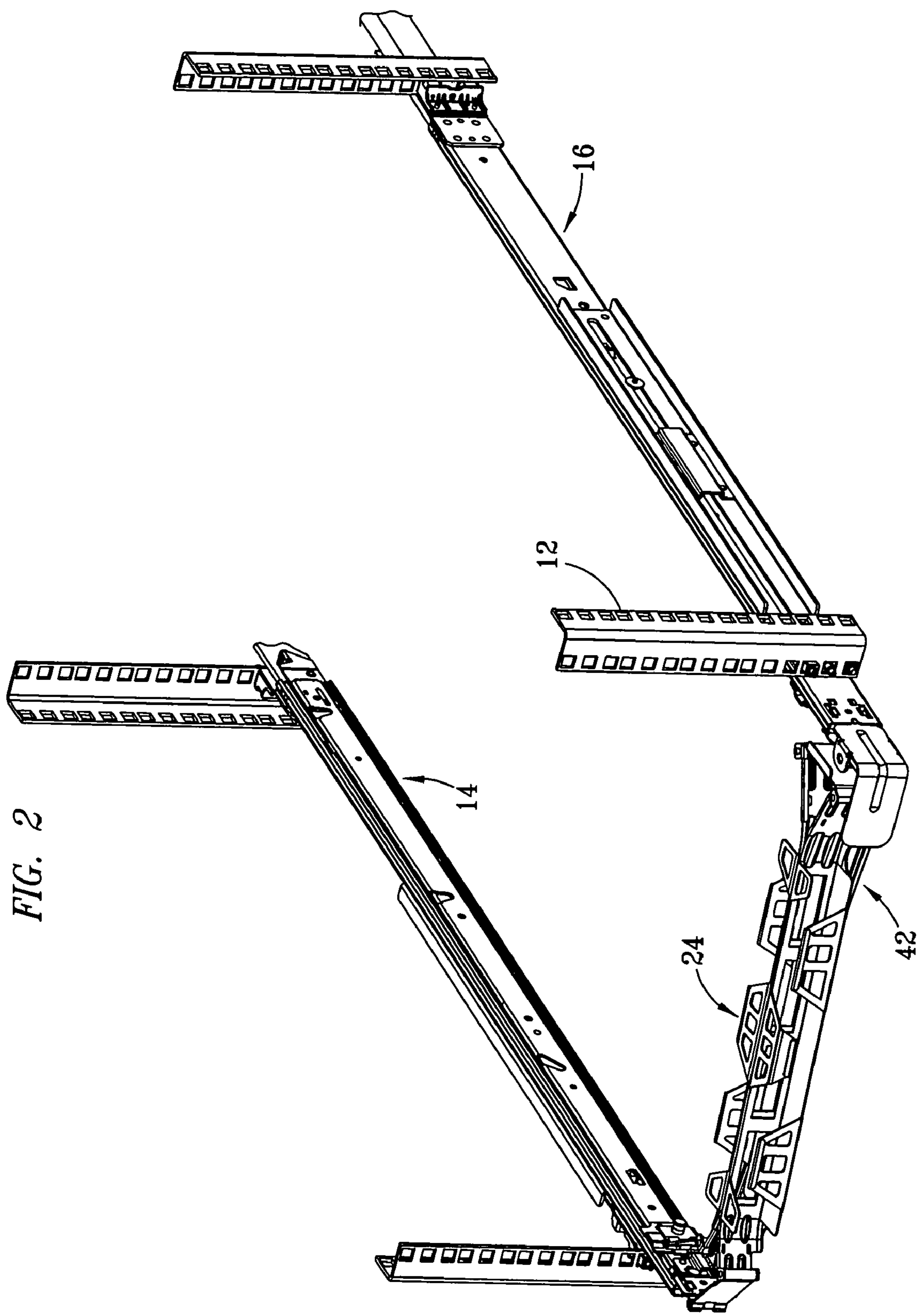

FIGS. 1 and 2 are perspective views of a rack 12 of a cabinet to which two drawer slides 14 and 16, and a cable management arm ("CMA") 24 are slidably secured, with FIG. 1 showing the drawer slides 12 and 14, and the CMA 24 in telescopically extended positions, and FIG. 2 showing the drawer slides 12 and 14, and the CMA 24 in retracted positions. The drawer slides 14 and 16 are disposed in opposed relation, on opposite sides of a rack 12, for supporting a chassis 8 (shown in phantom). The CMA 24 provides support for cabling 10 (shown in phantom) which extends between the chassis 8 and the rack 12. The drawer slides 14 and 16 each include a cabinet member 18, which is secured in fixed relation to the rack 12, an intermediate member 20 which is slidably extensible from within the cabinet member 18, and a chassis member 22 which is slidably extensible from within the intermediate member 20. The chassis 8 is mounted in fixed relation to the chassis member 22 for extending from within the rack 12 and being supported by the drawer slides 14 and 16 in cantilevered fashion. The CMA 24 is preferably secured to the drawer slide 14, with a forward end of the CMA 24 preferably secured in fixed relation to the rearward end of the chassis member 22 of the drawer slide 14 and the rearward end of the CMA 24 preferably pivotally secured in fixed relation to a rearward end of the cabinet member 18 of the drawer slide 14. The CMA 24 includes two main support sections 26 and 28. The support section 26 and the support section 28 are pivotally secured to an intermediate pivot section 30. End pivot sections 32 and 34 are directly secured to the rearward end of the chassis member 22 and the rearward end of the cabinet member 18 of the drawer slide 14, respectively. The sections 26, 28, 30, 32 and 34 collectively define a forward portion 36, a central portion 38 and a rearward portion 40 for the CMA 24.

A telescoping support crossbar 42 is provided by a slide 44 having a first member 46 and a second member 48, with the second member 48 slidably extensible from within the first member 46. Preferably, the forward end 50 of the telescoping support crossbar 42 is pivotally secured to the rearward end of the intermediate member 20 of the drawer slide 14, to which the CMA 24 is pivotally mounted. A rearward end 52 of the telescoping support crossbar 42 is pivotally mounted to a rearward end of the cabinet member 18 of the drawer slide 16, preferably disposed on an opposite side of the rack frame 12 from the drawer slide 14 to which the CMA 24 is pivotally secured. The end 50 has a hole 54 (shown in FIG. 3) and the end 52 has a hole which is preferably the same as the hole 54 in the end 50. The hole 54 in the end 50 and the hole in the end 54 each have flats to define keyed shapes for aligning with a flat 68 on the pivot fastener 60 (shown in FIG. 5) to align the ends 50 and 52 with the pivot fastener 60. An engagement member 58 is mounted to an upwardly facing side of the telescoping support crossbar 42 to define an uppermost portion of the slide 44. The engagement member 58 is preferably mounted to the upward side of the second member 48, providing an uppermost portion of the telescoping support crossbar 42 for the CMA 42 to slide upon. The engagement member 58 is preferably made of a low friction plastic material, such as Teflon®, which provides a reduced friction engagement surface for the lower end of the CMA 24 to slidably engage upon with low friction, as opposed to having metal-to-metal contact engagement of the CMA 24 with the crossbar members 46 and 48. (See FIG. 3). In the preferred embodiment, the engagement member 58 is provided by a plastic strip having an adhesive backing for securing the engagement member 58 to the upper side of the first member 48. In other embodiments, the engagement member 58 may be mechanically secured to the upper side of the support crossbar 42, such as with mechanical fasteners.

Figure 3:
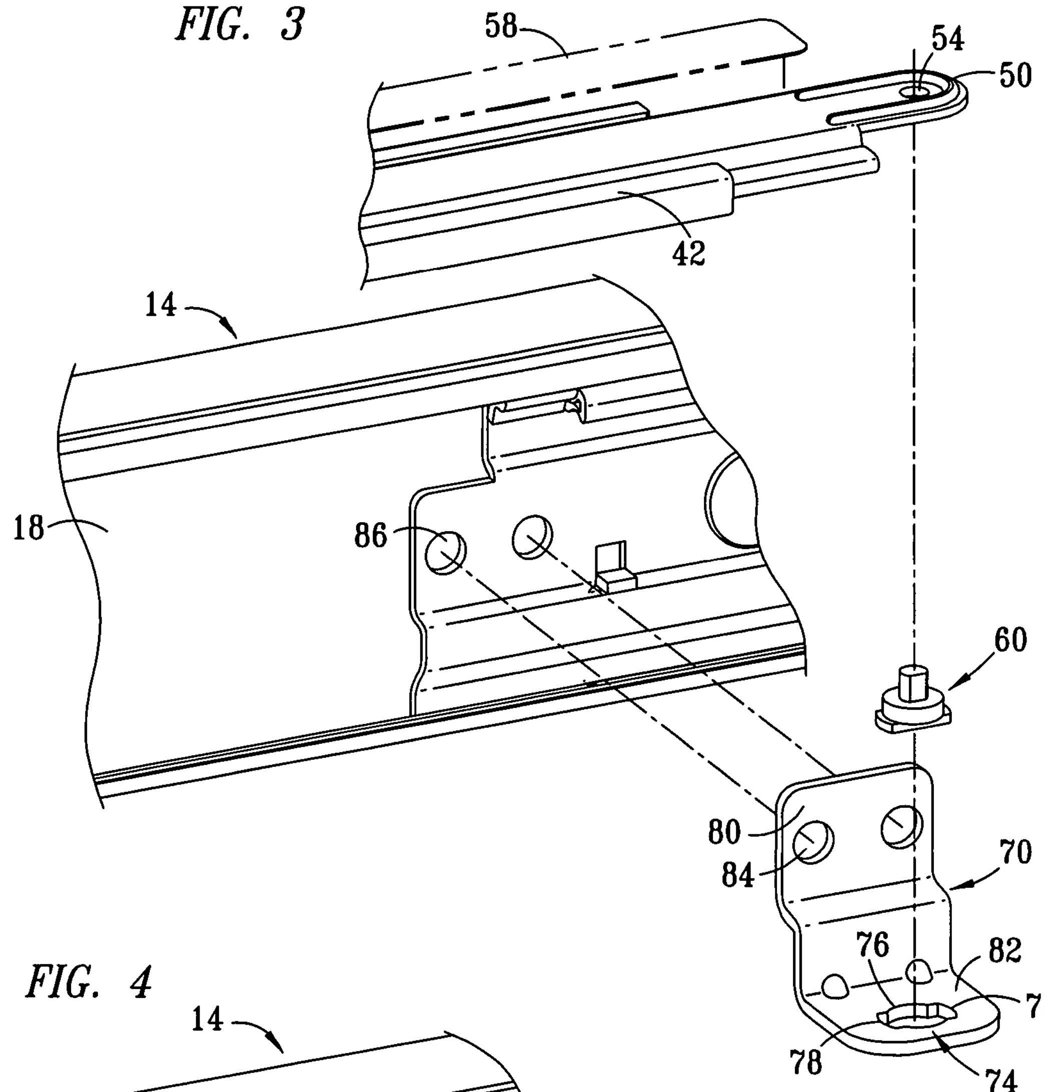
Figure 4:
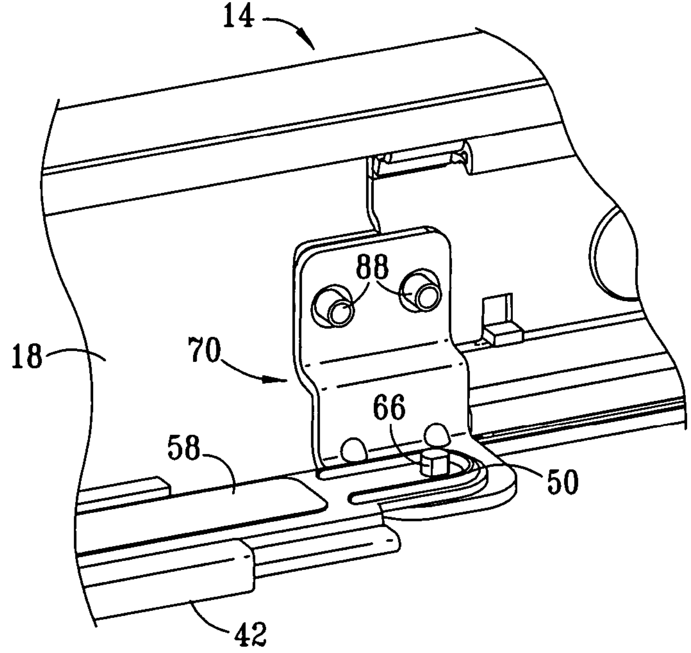

FIG. 3 is an exploded view and FIG. 4 is an assembled view of a mounting bracket 70 and pivot pin 60 for securing the forward end 50 of the telescoping support crossbar 42 to the rearward end of the intermediate member 20. The mounting bracket 70 has a mounting tab 80 and a tab 82, with the tab 82 preferably being disposed perpendicular to the mounting tab 80. The mounting tab 80 fits flush against a sidewall of the intermediate member 20, with rivet holes 84 formed in the mounting tab 80 aligned in registration with rivet holes 86 formed in the sidewall of the intermediate member 20 for securing with rivets 88. The tab 82 has a keyed hole 74 with a centrally disposed round portion 76 and two opposed slots 78 on opposite sides of the round portion 76. The round portion 76 defines a bearing surface for engaging the pivot pin 60.

Figure 5:
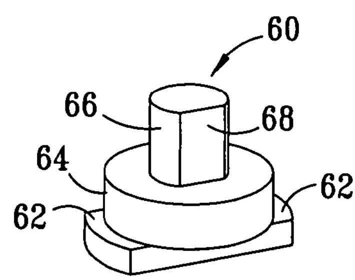

FIG. 5 is a perspective view of the pivot pin 60. The pivot pin 60 has one end with two oppositely extending retaining tabs 62, a round-shaped bearing portion 64 and a fastening portion 66. The fastening portion 66 is flattened when disposed as shown in FIG. 4 to define a rivet head for securing the pivot pin 60 within the end 50 of the telescoping support crossbar 42. A flat 68 is provided on an edge of the fastening portion 66 to provide a keyed shape to prevent the tabs 62 from rotating relative to the end 50 of the support crossbar 42. The tabs 62 extend in opposite directions for passing through the slots 78 in the keyed hole 74. The slots 78 are aligned relative to the drawer slide 14 and the retaining tabs 62 are aligned relative to the end 50 the support crossbar 42, such that the retaining tabs 62 cannot be aligned with the slots 78 for removing the pivot pin 60 from the keyed hole 74 of the mounting bracket 70 when the telescoping support crossbar 42 is secured to the drawer slides 14 and 16.

Figure 6:
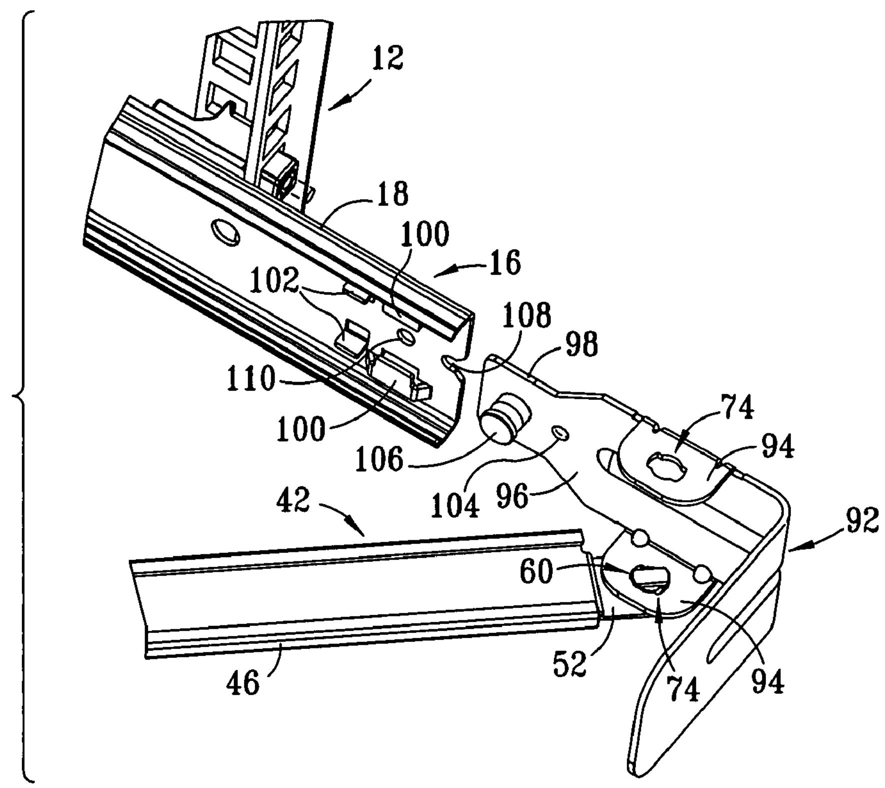
Figure 7:
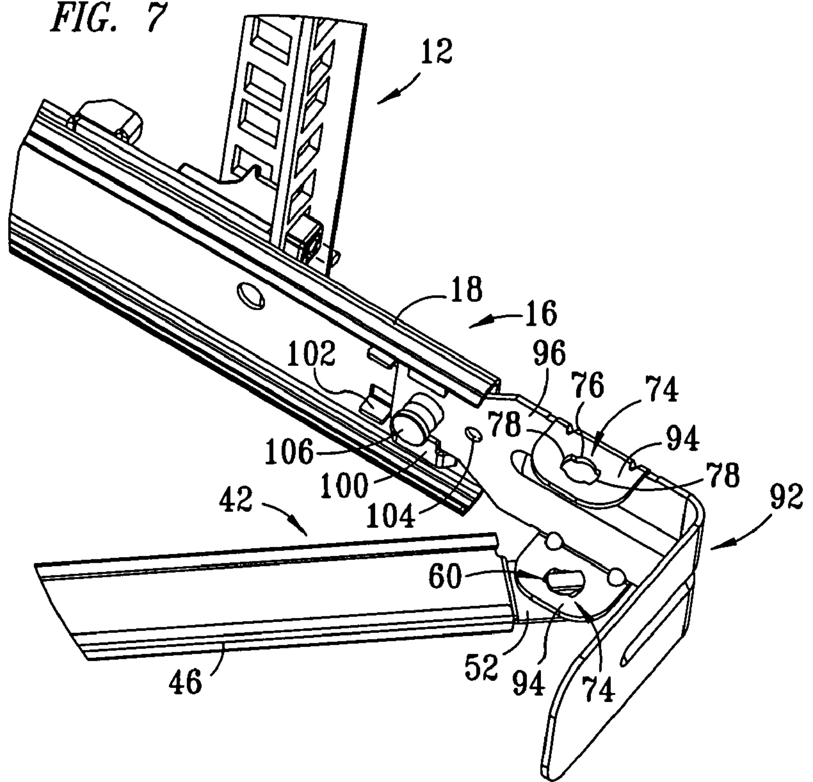

FIG. 6 is a partially exploded view and FIG. 7 is an assembled view of a mounting bracket 92 for securing the telescoping support crossbar 42 to the rearward end of a cabinet member 18. The mounting bracket 92 has two tabs 94 and a mounting tab 96. The two tabs 94 each have a keyed hole 74 with a centrally disposed round portion 76 and two opposed slots 78 on opposite sides of the round portion 76. The slots 78 are aligned relative to the drawer slide 16 and the retaining tabs 62 are aligned relative to the end 52 the support crossbar 42, such that the retaining tabs 62 cannot be aligned with the slots 78 for removing the pivot pin 60 from the keyed hole 74 of the mounting bracket 92 when the mounting bracket 92 is secured to the drawer slide 16 and the end 50 is secured to the mounting bracket 70. The mounting tab 96 has an edge 98 that fits between two opposed lock tabs 100 and against two stop tabs 102 for aligning and securing the mounting bracket 92 to the rearward end of the cabinet member 18. An indentation 104 is formed in the wall of the mounting tab 96 to provide a protrusion on the opposite side of the bracket 92 from that shown. The protruding side of the indentation 104 fits into a centrally disposed edge slot 108 formed into the rearward end of the cabinet member 18. A captive fastener 106 is provided by a spring-loaded plunger having a pin for fitting within an aperture 110 formed into the sidewall in a rearward portion of the cabinet member 18 to secure the bracket 92 to the rearward end of the cabinet member 18, until released by pulling the captive fastener outward from extending within the hoe 110. The captive fastener is preferably provided by a spring loaded plunger having Southco Part No. 56-60-16, available from Southco, Inc. of Concordville, Pa. See www.southco.com.

The support crossbar 42 is secured to the drawer slides 14 and 16 by first securing the forward end 50 of the support crossbar 42 to the rearward end of the intermediate member 20 of the drawer slide 14, and then securing the rearward end 52 of the support crossbar 42 to the rearward end of the cabinet member 18 of the drawer slide 16. The forward end 50 of the support crossbar 42 is secured to the drawer slide 14 prior to securing the rearward end 50 of the support crossbar 42 to the drawer slide 16, while the rearward end 52 is free to move relative to the drawer slide 16 so that the retaining tabs 62 on the pivot pin 60 which is secured to the forward end 50 can be aligned with the slots 78 of the keyed hole 74 in the mounting bracket 70. The retaining tabs 62 on the forward end 50 are then aligned with and passed through the slots 78 of the mounting bracket 70 and then rotated relative to the slots 78 to secure the forward end 50 to the drawer slide 14. Then, the mounting bracket 92 is secured to the rearward end 52 of the support crossbar 42 prior to securing the mounting bracket 92 to the rearward end of the drawer slide 16. The tabs 62 of the pivot pin 60 mounted to the end 52 are aligned with and then passed through the slots 78 in the keyed hole 78 of the tab 94 of the mounting bracket 92, and then the mounting bracket 92 is rotated to move the tabs 62 from alignment with the slots 78 and to align the mounting tab 96 for securing to the cabinet member 18 of the drawer slide 16. The mounting tab 96 will then be moved to engage between the two opposed mounting tabs 100 and against the two stop tabs 102, and the indentation 104 fits within the edge slot 108. The mounting tabs 100, the two stop tabs 102, the indentation 104 and the edge slot 108 together provide alignment means for aligning the end tab 96 of the bracket 92 in fixed alignment with the rearward end of the chassis member 18. The spring-loaded plunger captive fastener 106 fits in the hole 110 to lock the bracket in the fixed alignment with the rearward end of the chassis member 18. This secures the rearward end 52 of the support crossbar 42 to the drawer slide 16, with the retaining tabs 62 of the pivot pins 60 not able to align with respective slots 78 in keyed holes 74 without removal of the mounting bracket 92 from the chassis member 18 of the drawer slide 16.

Preferably, the CMA 24 is not directly secured to the telescoping support crossbar 42. Rather, the CMA 24 rests upon the telescoping crossbar support 42 and is freely moveable upon the telescoping support crossbar 42 in at least two orthogonally disposed directions 112 and 114, shown in FIG. 1. The orthogonally disposed directions 112 and 114 preferably define a horizontal plane in which the drawer slides 14 and 16 telescopically extend, the telescoping support crossbar 42 extends, and the chassis 8 moves inward and outward of the rack 12. With the CMA 24 being freely movable upon the telescoping support crossbar 42, and thus not directly secured to the support crossbar 42, the CMA 24 may be installed and removed from the rack 12 without requiring removal of the support crossbar 42, or disassembly of the CMA 24 from the telescoping support crossbar 42.

The telescoping support crossbar of the present invention provides advantages of a telescoping support member for slidably engaging the lower end of a CMA to support the weight of the CMA and cabling secured thereto. Lighter weight materials may be used for the CMA with the telescoping support crossbar supporting the weight of a central portion of the CMA and cabling secured to the CMA. The telescoping support crossbar extends with the intermediate member and provides support for a central portion of the CMA. The CMA is not secured to the telescoping support crossbar, such that the CMA is freely moveable upon the crossbar in two orthogonally disposed directions in a horizontal plane.

Although the preferred embodiment has been described in detail, it should be understood that various changes, substitutions and alterations can be made therein without departing from the

What is claimed is:

1. In an apparatus for mounting a chassis to a rack, the apparatus having a first drawer slide, a second drawer slide and a cable management arm, said first and second drawer slides each including a cabinet member and a chassis member, with said chassis member being telescopically extensible relative to said cabinet member, wherein said first and second drawer slides are adapted for mounting to the rack in spaced apart, opposed relation, with said cabinet members mounted in stationary relation to the rack and said chassis members moveable relative to respective ones of said cabinet members with opposite sides of the chassis supported in cantilever fashion by said chassis members, said cable management arm having a forward portion, a central portion and a rearward portion, said cable management arm adapted for moveably mounting said forward portion in fixed relation to one of said chassis members and moveably mounting said rearward portion in fixed relation to one of said cabinet members, the improvement comprising:

a support member having a first member and a second member, with said first member slidably secured to said second member for telescopically extending relative to said second member, wherein said support member has a first end pivotally secured in fixed relation to an intermediate portion of one of said first and second drawer slides, and said support member has a second end pivotally secured in fixed relation to a rearward portion of an other of said first and second drawer slides; and wherein said first and second drawer slides extend and retract with said forward portion of said cable management arm moving with said one of said chassis member, said forward end of said support member moving with said intermediate portion of said one of said first and second drawer slides, and said support member disposed beneath and in sliding engagement with said central portion of said cable management arm.

2. The apparatus according to claim 1, further comprising said support member having an engagement portion secured to an uppermost portion of one of said first and second members for slidably engaging said intermediate portion of said cable management arm in a reduced friction engagement over metal to metal contact.

3. The apparatus according to claim 2, wherein said engagement member is formed of a strip of plastic material.

4. The apparatus according to claim 3, wherein said cable management arm is freely movable relative to said support member in at least two orthogonally disposed directions in a horizontal plane.

5. The apparatus according to claim 1, further comprising:

a mounting bracket fixedly secured to one of said drawer slides, said mounting bracket having a keyed hole, wherein said keyed hole has a central round portion and a slot; and a pivot pin having a retaining tab, a bearing portion and a fastening pin portion, wherein said retaining tab passes through said central round portion and said slot and is aligned aside of said slot with mounting of said support member to said first and second drawer slides, said bearing portion rotatably fits within and rotatably engages said central round portion of said keyed hole, and said fastening pin portion secures to an end of said support member.

6. The apparatus according to claim 5, wherein said fastening pin portion has a flat and said keyed hole as a flat to prevent rotation of said pivot pin relative to said end of said support member.

7. The apparatus according to claim 6, further comprising said support member having an engagement portion secured to an uppermost portion of one of said first and second members for slidably engaging said intermediate portion of said cable management arm in a reduced friction engagement as compared to metal-to-metal contact.

8. An apparatus for mounting a chassis to a rack, the apparatus comprising:

a first drawer slide and a second drawer slide, each having a cabinet member, an intermediate member and a chassis member which are telescopically extensible, wherein said first and second drawer slides are adapted for mounting to the rack in spaced apart, opposed relation, with said cabinet members mounted in stationary relation to the rack and said chassis members adapted for supporting opposite sides of the chassis;

a cable management arm having a first portion and a second portion, said cable management arm adapted for pivotally mounting said first portion in fixed relation to said chassis member and said second portion in fixed relation to said cabinet member;

a support member having a first member and a second member, with said first member slidably secured to said second member for telescopically extending in relation to said second member, wherein said first member is pivotally secured in fixed relation to a rearward portion of said intermediate member and said second member is pivotally secured in fixed relation to said cabinet member; and wherein extension of said first and second drawer slides extends said cable management arm and said support member, with said support member disposed beneath an intermediate portion of said cable management arm in sliding engagement with said cable management arm.

9. The apparatus according to claim 8, further comprising said support member having an engagement portion secured to an uppermost portion of one of said first and second members for slidably engaging said intermediate portion of said cable management arm in a reduced friction engagement as compared to metal-to-metal contact.

10. The apparatus according to claim 9, wherein said engagement member is formed of a strip of plastic material.

11. The apparatus according to claim 8, further comprising:

a mounting bracket fixedly secured to one of said drawer slides, said mounting bracket having a keyed hole, wherein said keyed hole has a central round portion and a key-way slot; and a pivot pin having a retaining tab, a bearing portion and a fastening pin portion, wherein said retaining tab passes through said central round portion and said slot and is aligned aside of said slot with mounting of said support member to said first and second drawer slides, said bearing portion rotatably fits within and rotatably engages said central round portion of said keyed hole, and said fastening pin portion is deformed to define a rivet end securing said pivot pin to said end of said support member.

12. The apparatus according to claim 11, wherein said fastening pin portion has a flat and said keyed hole as a flat to prevent rotation of said pivot pin relative to said end of said support member.

13. The apparatus according to claim 12, further comprising said support member having an engagement portion secured to an uppermost portion of one of said first and second members for slidably engaging said intermediate portion of said cable management arm in a reduced friction engagement as compared to metal-to-metal contact.

14. An apparatus for mounting a chassis to a rack, the apparatus comprising:

a first drawer slide and a second drawer slide, each having a cabinet member, an intermediate member and a chassis member which are telescopically extensible, wherein said first and second drawer slides are adapted for mounting to the rack in spaced apart, opposed relation, with said cabinet members mounted in stationary relation to the rack and said chassis members adapted for supporting opposite sides of the chassis;

a cable management arm having a first portion and a second portion, said cable management arm adapted for pivotally mounting said first portion in fixed relation to said chassis member and said second portion in fixed relation to said cabinet member;

a support slide having a first slide member and a second slide member, with said first slide member slidably secured to telescopically extend from said second member, wherein one of said first slide member and said second slide member is pivotally secured in fixed relation to a rearward portion of said intermediate member and an other of said first slide member and said second member is pivotally secured in fixed relation to said cabinet member; and wherein extension of said first and second drawer slides extends said cable management arm and said support slide, with said support slide disposed beneath and supportively engaging an intermediate portion of said cable management arm in sliding engagement with said cable management arm, and said cable management arm being freely movable relative to said support member in at least two orthogonally disposed directions in a horizontal plane.

15. The apparatus according to claim 14, further comprising:

a mounting bracket fixedly secured to one of said drawer slides, said mounting bracket having a keyed hole, wherein said keyed hole has a central round portion and a key-way slot; and a pivot pin having a retaining tab, a bearing portion and a fastening pin portion, wherein said retaining tab passes through said central round portion and said key-way slot, and is rotated to prevent said retaining tab to pass through said key-way slot, said bearing portion rotatably fits within and rotatably engages said central round portion of said keyed hole, and said fastening pin portion secures to an end of said support slide.

16. The apparatus according to claim 15, wherein said fastening pin portion has a flat and said keyed hole as a flat to prevent rotation of said pivot pin relative to said end of said support member.

17. The apparatus according to claim 16, further comprising said support slide having an engagement portion formed of a strip of plastic secured to an uppermost portion of one of said first and second members for slidably engaging said intermediate portion of said cable management arm.

* * * * *